United States Patent
Sarkhel

(10) Patent No.: US 6,581,821 B2
(45) Date of Patent: Jun. 24, 2003

(54) ELECTRONIC PACKAGE INTERCONNECT STRUCTURE COMPRISING LEAD-FREE SOLDERS

(75) Inventor: Amit K. Sarkhel, Endicott, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/197,291

(22) Filed: Jul. 16, 2002

(65) Prior Publication Data

US 2002/0192443 A1 Dec. 19, 2002

Related U.S. Application Data

(62) Division of application No. 09/660,558, filed on Sep. 12, 2000, now Pat. No. 6,433,425.

(51) Int. Cl.⁷ .............................................. B23K 31/02
(52) U.S. Cl. .............................. 228/180.21; 228/180.22
(58) Field of Search ........................ 228/180.21, 180.22

(56) References Cited

U.S. PATENT DOCUMENTS

| | | | |
|---|---|---|---|
| 2,105,405 A | * | 1/1938 | Chase |
| 5,147,084 A | | 9/1992 | Behun et al. |
| 5,221,038 A | * | 6/1993 | Melton et al. ............ 228/180.2 |
| 5,256,370 A | | 10/1993 | Slattery et al. |
| 5,328,660 A | | 7/1994 | Gonya et al. |
| 5,439,639 A | * | 8/1995 | Vianco et al. .............. 420/562 |
| 5,533,256 A | | 7/1996 | Call et al. |
| 5,573,172 A | * | 11/1996 | Gore ........................ 28/180.22 |
| 5,580,520 A | | 12/1996 | Slattery et al. |
| 5,655,703 A | | 8/1997 | Jimarez et al. |
| 5,658,528 A | | 8/1997 | Ninomiya et al. |
| 5,730,932 A | * | 3/1998 | Sarkhel et al. .............. 420/562 |
| 5,733,501 A | | 3/1998 | Takao et al. |
| 5,843,371 A | | 12/1998 | Yoo et al. |
| 5,874,043 A | | 2/1999 | Sarkhel et al. |
| 5,918,795 A | | 7/1999 | Yamaguchi et al. |
| 5,988,485 A | * | 11/1999 | Master et al. .......... 228/180.22 |
| 6,010,060 A | * | 1/2000 | Sarkhel et al. ............ 228/179.1 |
| 6,056,191 A | * | 5/2000 | Brouillette et al. ......... 228/254 |
| 6,224,690 B1 | * | 5/2001 | Andricacos et al. ........ 148/400 |
| 6,297,559 B1 | * | 10/2001 | Call et al. .................... 257/778 |
| 6,337,445 B1 | * | 1/2002 | Abbott et al. ............... 174/260 |

OTHER PUBLICATIONS

Circuits Assembly, May 2000, vol. 11, No. 5, Research Update: Lead–Free Solder Alternatives, Bath et al., 7 pages.
Hanson, M., Constitution of Binary Alloys, 1985, Genium (No month) Publishing Corporation, 4 pages.

* cited by examiner

Primary Examiner—Cathy Lam
(74) Attorney, Agent, or Firm—Schmeiser, Olsen & Watts; Lawrence R. Fraley

(57) ABSTRACT

A method and structure for forming an electronic package with an interconnect structure that comprises lead-free solders. The method first forms a module by initially providing a chip carrier, a first joiner solder that is lead-free, and a core interconnect (e.g., solder ball, solder column) that includes a lead-free core solder. The liquidus temperature $T_{1L}$ of the first joiner solder is less than a solidus temperature $T_{CS}$ of the core solder. A first end of the core interconnect is soldered to the chip carrier with the first joiner solder, which includes reflowing the first joiner solder at a reflow temperature that is above $T_{1L}$ and below $T_{CS}$, followed by cooling the first joiner solder to a temperature that is below a solidus temperature of the first joiner solder. Thus, the module with the soldered core interconnect has been formed. The method then provides a circuit card and a second joiner solder that is lead-free. The liquidus temperature $T_{2L}$ of the second joiner solder is less than $T_{CS}$. A second end of the core interconnect is soldered to the circuit card with the second joiner solder, which includes reflowing the second joiner solder at a reflow temperature that is above $T_{2L}$ and below $T_{CS}$, followed by cooling the second joiner solder to a lower temperature that is below a solidus temperature of the second joiner solder.

16 Claims, 2 Drawing Sheets

ELECTRONIC PACKAGE INTERCONNECT STRUCTURE COMPRISING LEAD-FREE SOLDERS

This application is a divisional of Ser. No. 09/660,558 filed on Sep. 12, 2000, now U.S. Pat. No. 6,433,425.

BACKGROUND OF THE INVENTION

1. Technical Field

The present invention relates to a method and structure for forming an electronic package with an interconnect structure that comprises lead-free solders.

2. Related Art

A chip carrier is typically coupled to a circuit card by a solder interconnect structure that includes a grid array such as a ball grid array (BGA) or a column grid array (CGA). In particular, a lead-comprising solder interconnect (e.g., a lead-comprising solder ball of a BGA or a lead-comprising solder column of a CGA) is joined to the chip carrier by use of a first lead-comprising joining solder. Similarly, the lead-comprising solder interconnect is joined to the circuit card by use of a second lead-comprising joining solder. Unfortunately, lead is toxic and environmentally hazardous. Thus, there is a need for a lead-free solder interconnect structure for coupling a chip carrier to a circuit card.

SUMMARY OF THE INVENTION

The present invention provides electronic structure comprising:

an electronic component; and a solder structure solderably coupled to the electronic component, wherein the solder structure includes:
  a joiner interconnect comprising a joiner solder, wherein the joiner solder is lead free; and
  a core interconnect comprising a core solder, wherein the core solder is lead free, wherein the joiner interconnect solderably couples an end of the core interconnect to the electronic component, and wherein a liquidus temperature of the joiner solder is less than a solidus temperature of the core solder.

The present invention provides an electronic structure, comprising:

a first electronic component;

a second electronic component; and a solder interconnect structure which solderably couples the first electronic component to the second electronic component, wherein the solder interconnect structure includes:
  a first joiner interconnect comprising a first joiner solder that is lead free and has a liquidus temperature $T_{1L}$;
  a second joiner interconnect comprising a second joiner solder that is lead free and has a liquidus temperature $T_{2L}$; and
  a core interconnect comprising a core solder that is lead free and has a solidus temperature $T_{CS}$, wherein the first joiner interconnect solderably couples a first end of the core interconnect to the first electronic component, wherein the second joiner interconnect solderably couples a second end of the core interconnect to the second electronic component, wherein $T_{1L}<T_{CS}$, and wherein $T_{2L}<T_{CS}$.

The present invention provides a method of forming an electronic structure, comprising:

providing an electronic component, a joiner solder, and a core interconnect, wherein the joiner solder is lead free, wherein the core interconnect includes a core solder, wherein the core solder is lead free, and wherein a liquidus temperature $T_{1L}$ of the joiner solder is less than a solidus temperature $T_{CS}$ of the core solder;

soldering an end of the core interconnect to the electronic component with the joiner solder, including reflowing the joiner solder at a reflow temperature that is above $T_{1L}$ and below $T_{CS}$; and cooling the joiner solder to a temperature that is below a solidus temperature of the joiner solder.

The present invention provides a method of forming an electronic structure, comprising:

providing a module that includes a first electronic component, a first joiner interconnect, and a core interconnect, wherein the first joiner interconnect solderably couples a first end of the core interconnect to the first electronic component, wherein the first joiner interconnect includes a first joiner solder that is lead free and has a liquidus temperature $T_{1L}$, wherein the core interconnect comprises a core solder that is lead free and has a solidus temperature $T_{CS}$, and wherein $T_{1L}<T_{CS}$;

providing a second electronic component and a second joiner solder, wherein the second joiner solder is lead free and has a liquidus temperature $T_{2L}$, and wherein $T_{2L}<T_{CS}$;

soldering a second end of the core interconnect to the second electronic component with the second joiner solder, including reflowing the second joiner solder at a reflow temperature $T_{R2}$ that is above $T_{2L}$ and below $T_{CS}$; and cooling the second joiner solder to a temperature that is below a solidus temperature of the second joiner solder.

The present invention provides a lead-free solder interconnect structure for coupling a chip carrier to a circuit card.

DETAILED DESCRIPTION OF THE INVENTION

Figure 1:
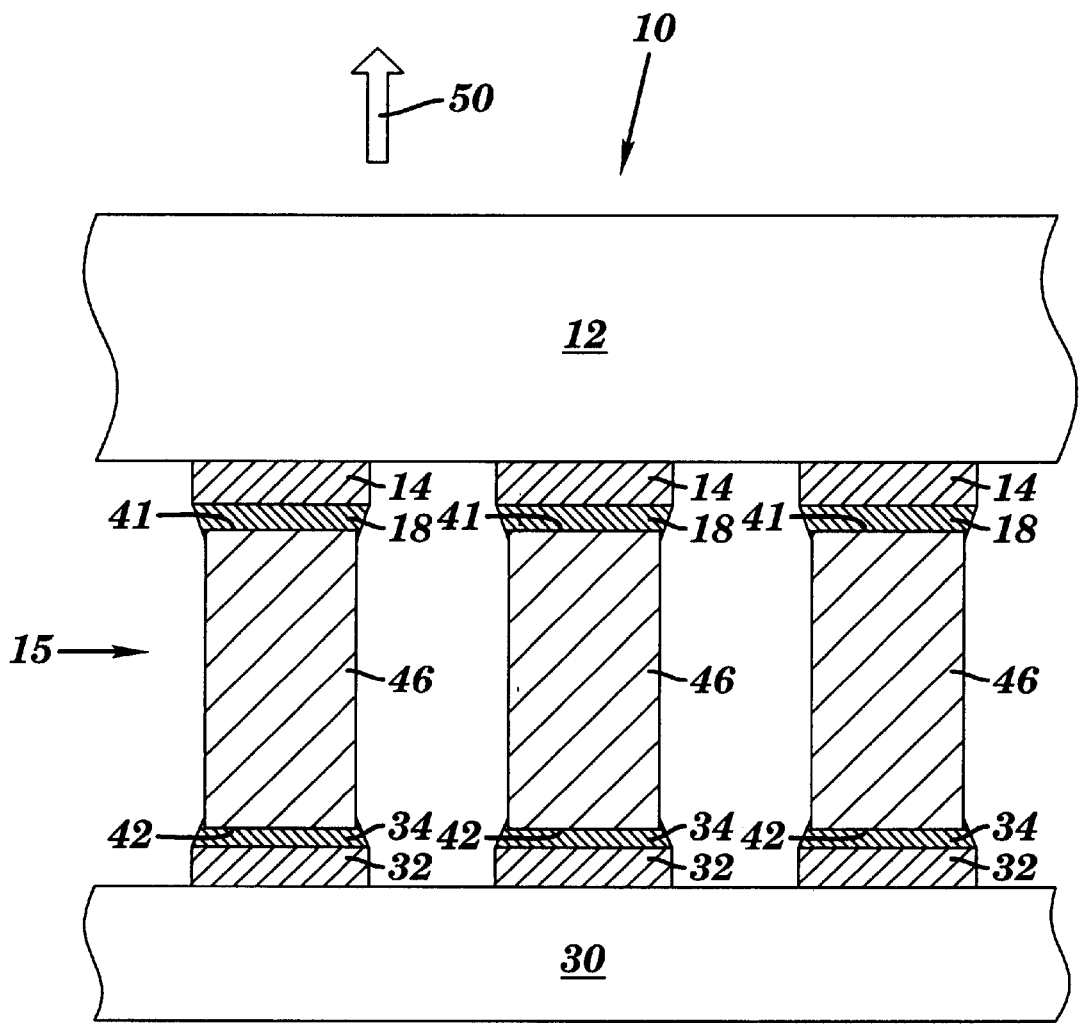
FIG. 1 depicts a front, cross-sectional view of an electronic structure that includes a core interconnect of a solder column, in accordance with the embodiments of the present invention.

FIG. 1 illustrates a front, cross-sectional view of an electronic structure 10, in accordance with the embodiments of the present invention. The electronic structure 10 includes a first electronic component 12 having a conductive pad 14, a second electronic component 30 having a conductive pad 32, and a solder interconnect structure 15 which solderably couples the first electronic component 12 to the second electronic component 30. The first electronic component 12 may include, inter alia, a first circuitized substrate such as chip carrier. The second electronic component 30 may include, inter alia, a second circuitized substrate such as a circuit card. The solder interconnect structure 15 includes a first joiner interconnect 18, a second joiner interconnect 34, and a core interconnect 46. The first joiner interconnect 18 solderably couples a first end 41 of the core interconnect 46 to the first electronic component 12 at the pad 14. The second joiner interconnect 34 solderably couples a second end 42 of the core interconnect 46 to the second electronic component 30 at the pad 32.

The first joiner interconnect 18 comprises a first joiner solder that is lead free and has a liquidus temperature $T_{1L}$. The second joiner interconnect 34 comprises a second joiner solder that is lead free and has a liquidus temperature $T_{2L}$. The core interconnect 46 comprises a core solder that is lead free and has a solidus temperature $T_{CS}$.

A solder may include an individual metal or may include an alloy. An individual metal melts at a distinct temperature, and an alloy generally melts over a finite temperature range. An alloy that melts at a distinct temperature is said to have a eutectic composition of its constituent metals. For example, a solder of 96.5% tin and 3.5% silver is a eutectic mixture of tin and silver that melts at the distinct temperature of 221° C. Generally, an alloy is said to comprise "eutectic tin-silver" if such alloy comprises tin and silver, in addition to any other metals which may be present, such that a ratio of tin to silver by weight is 96.5/3.5, or about 27.6. A The solidus temperature of a solder is a temperature below which the solder is totally solid. The liquidus temperature of a solder is a temperature above which the solder is totally liquid. The solidus temperature of a solder is less than the liquidus temperature if the solder includes an alloy that melts over a finite temperature range. The solidus temperature of a solder is equal to the liquidus temperature if the solder includes an individual metal or includes an alloy having a eutectic composition.

The core interconnect 46 is a solder column in FIG. 1 as part of a column grid array (CGA). Generally, the core interconnect 46 may have any geometry that has a length in the axial direction 50. For example, FIG. 2 differs from FIG. 1 in that the core interconnect 46 has been replaced by the core interconnect 16. The core interconnect 46 is a solder column of a CGA, while the core interconnect 16 is a solder ball of a ball grid array (BGA). The core interconnect 46 (or the core interconnect 16) reduces thermally induced strain at solder joints at the first joiner interconnect 18 and at the second joiner interconnect 34. A cause of the strain includes differential thermal expansion or contraction between the first electronic component 12 (e.g., chip carrier) and the second electronic component 30 (e.g., circuit card) during thermal cycling or other temperature transients. The differential thermal expansion or contraction results from a difference in coefficient of thermal expansion (CTE) between the first electronic component 12 and the second electronic component 30. For example, a circuit card may have a CTE in a range of approximately 14 to 22 ppm/° C., while a ceramic chip carrier may have a CTE in a range of approximately 6 to 11 ppm/° C. and an organic chip carrier may have a CTE in a range of approximately 6 to 24 ppm/° C. The core interconnect 46 (or the core interconnect 16) mitigates the strain by distributing much of the strain over its length in the axial direction 50. Thus the core interconnect 46 (or the core interconnect 16) serves to prevent collapse of the solder joints at the first joiner interconnect 18 and at the second joiner interconnect 34 thereby increasing a fatigue life of the solder joints.

Fabricating the electronic structure 10 comprises fabricating a module and solderably coupling the module to the second electronic component 30. The module includes the the core interconnect 46 solderably coupled to the first electronic component 12 by the first joiner interconnect 18.

Fabricating the module includes soldering the first end 41 of the core interconnect 46 (or the first end 21 of the core interconnect 16 in FIG. 2) to the pad 14 of the first electronic component 12. Such soldering includes reflowing the first joiner solder of the first joiner interconnect 18 by heating the first joiner solder to a reflow temperature $T_{R1}$ (i.e., to a temperature at which the first joiner solder totally melts) using any method known to one of ordinary skill in the art, such as by using an oven, a laser, etc. Following the reflow, the first joiner solder is cooled to a temperature that is below a solidus temperature of the first joiner solder (e.g., cooling the first joiner solder to ambient room temperature). The reflow is performed such that the core interconnect 46 does not melt, which necessitates a choice of first joiner solder, core solder and the reflow temperature $T_{R1}$ such that $T_{1L}<T_{R1}<T_{CS}$. To insure against uncertainties and nonuniformities in the spatial distribution of reflow temperature and to account for spatial inhomogeneities in the first joiner solder or in the core solder, a temperature margin between $T_{1L}$ and $T_{CS}$ may be conservatively chosen (e.g., $T_{CS}>T_{1L}+$ 10° C.; the margin of 10° C. is merely illustrative and any desired margin is within the scope of the present invention). The soldering may be preceded by fluxing the end 41 as is known to one of ordinary skill in the art. Fluxing removes surface oxides and surface contaminants from the core interconnect 46 and prevents reoxidation of the surfaces when the core interconnect 46 is heated prior to reflow. Thus, fluxing promotes wetting with the liquid first joiner solder at the reflow temperature. See E. G., D. P. Seraphim et al., "Principles of Electronic Packaging," pages 591–594, McGraw-Hill, Inc., 1989, for a discussion of fluxing.

After the module is fabricated, the module is solderably coupled to the second electronic component 30, which is accomplished by soldering the second end 42 of the core interconnect 46 (or the second end 22 of the core interconnect 16 in FIG. 2) to the pad 32 of the first electronic component 30. Such soldering includes reflowing the second joiner solder of the second joiner interconnect 34 by heating the second joiner solder to a reflow temperature $T_{R2}$ (i.e., to a temperature at which the second joiner solder totally melts) using any method known to one of ordinary skill in the art such as by using an oven, a laser, etc. Following the reflow, the second joiner solder is cooled to a temperature that is below a solidus temperature of the second joiner solder (e.g., cooling the second joiner solder to ambient room temperature). The reflow is performed such that the core interconnect 46 does not melt, which necessitates a choice of second joiner solder, core solder and the reflow temperature $T_{R2}$ such that $T_{2L}<T_{R2}<T_{CS}$. To insure against uncertainties and nonuniformities in the spatial distribution of reflow temperature and to account for spatial inhomogeneities in the second joiner solder or in the core solder, a temperature margin between $T_{2L}$ and $T_{CS}$ may be conservatively chosen (e.g., $T_{CS}>T_{2L}+10°$ C.; the margin of 10° C. is merely illustrative and any desired margin is within the scope of the present invention). The soldering may be preceded by fluxing the end 42 of the core interconnect 46 in a similar manner as was described supra for fluxing the end 41 in conjunction with fabricating the module.

As explained supra, the temperature relationships of the present invention include:

$$T_{1L}<T_{R1}<T_{CS} \text{ and} \tag{1}$$

$$T_{2L}<T_{R2}<T_{CS} \tag{2}$$

Generally, $T_{1L}$ and $T_{2L}$ are independent of each other except in special cases. In a first special case, the first joiner solder and the second joiner may include the same solder material, which implies $T_{1L}=T_{2L}$. In a second special case, it may be desirable to be able to rework the second joiner solder of the second joiner interconnect 34 subsequent to initial assembly; i.e., to reflow the second joiner solder without reflowing the first joiner solder of the first joiner interconnect 18. To insure that there is no melting of the first joiner solder during the reworking of the second joiner solder, The condition of Equation (2) is replaced by the condition $T_{2L}<T_{R2}<T_{1S}$, wherein $T_{1S}$ is a solidus temperature of the first joiner solder, which places a constraint on $T_{2L}$ in relation to $T_{1S}$ (i.e., $T_{2L}<T_{1S}$) and narrows the operational range of $T_{R2}$ relative to Equation (2). If partial melting, but not total melting, of the first joiner solder is allowed during the reworking of the second joiner solder, then the less stringent condition $T_{2L}<T_{R2}<T_{1M}$ must be satisfied, wherein a "melt temperature" $T_{1M}$ of the first joiner solder is a temperature at which at least a portion of second joiner solder melts and thus satisfies $T_{1S} \leq T_{1M} < T_{1L}$. Thus, reworkability of the second joiner solder requires:

$$T_{2L}<T_{R2}<T_{1M};\ T_{1S} \leq T_{1M}<T_{1L} \qquad (3)$$

Specific examples will now be given for choices of lead-free solder systems for the first joiner solder, the second joiner solder, and the core solder for satisfying Equations (1)–(3). Equation (1) and Equation (2) are unconditionally required. Equations (3) are required if a reworkability capability for the second joiner solder is to be supported. The solder system examples, which will be summarized and applied infra to Equations (1)–(3), each comprise an alloy having Tin (Sn) and at least one of the following metals: Antimony (Sb), Silver (Ag), Indium (In), Bismuth (Bi), and Copper (Cu). The following Table 1 shows six solder system examples with accompanying references as to the alloy compositions and the associated solidus and liquidus temperatures.

The following comments apply to the solder systems of Table 1. The Sn/Sb solder system has a ratio of Sn to Sb by weight ("Sn/Sb Ratio") in a range of about 1–32. Structural properties (e.g., brittleness) become more favorable as the Sn/Sb Ratio increases, and are particularly favorable if the Sn/Sb Ratio exceeds about 6.

Excepting the Sn/Sb solder system, the Sn/Ag solder system has the highest solidus and liquidus temperature, namely 221° C. The remaining solder systems (i.e., Sn/Ag/In/Bi, Sn/Ag/In, Sn/Ag/Bi, and Sn/Ag/Cu) each include Sn, Ag, and at least one additional metal, and each such remaining system has a solidus and liquidus temperature below 221° C. due to addition of the at least one additional metal. Thus, the solders of the remaining solder systems have a liquidus temperature that is less than a melting temperature of eutectic tin-silver.

The Sn/Ag solder system consists essentially of eutectic lead-tin (i.e., 96.5% tin and 3.5% silver, by weight), and is thus characterized by a ratio of Sn to Ag ("Sn/Ag ratio") of about 27.6 by weight.

The Sn/Ag/In/Bi solder system have solidus temperatures in a range of about 150–160° C., and liquidus temperatures in a range of about 180–190° C.

The Sn/Ag/In solder system comprises eutectic tin-silver (the Sn/Ag ratio is 27.6±0.4), so that the Sn/Ag/In alloys listed in Table 1 are differentiated solely by the percent composition of In ("% In") in a range of about 0–26%. The lower end of the range of % In does not include 0, but includes a positive, real number arbitrarily close to 0 as the Sn/Ag/In solder system approaches the Sn/Ag solder system. The solidus temperatures are in a range of about

TABLE 1

Solder Systems. $T_S$ = Solidus Temperature; $T_L$ = Liquidus Temperature

| Solder System (Reference) | % Composition By Weight | $T_S$ (° C.) | $T_L$ (° C.) | Ratio of Sn/Sb, Sn/Ag |
|---|---|---|---|---|
| Sn/Sb | 97 Sn/3 Sb | 233 | 238 | Sn/Sb = 32.3 |
| (Hanson, M.., | 95 Sn/5 Sb | 234 | 240 | Sn/Sb = 19.0 |
| "Constitution of | 90 Sn/10 Sb | 245 | 246 | Sn/Sb = 9.0 |
| Binary Alloys," | 85 Sn/15 Sb | 246 | 280 | Sn/Sb = 5.7 |
| Genium Publ., | 55 Sn/45 Sb | 280 | 420 | Sn/Sb = 1.2 |
| Schenectady, NY (1985)) | 50 Sn/50 Sb | 325 | 425 | Sn/Sb = 1.0 |
| Sn/Ag (Hanson, M.. - see above) | 96.5 Sn/3.5 Ag | 221 | 221 | Sn/Ag = 27.6 |
| Sn/Ag/In/Bi | 80.0 Sn/3.3 Ag/5.5 In/11.2 Bi | 160 | 186 | Sn/Ag = 24.2 |
| (U.S. Pat. No. | 80.8 Sn/2.5 Ag/5.5 In/11.2 Bi | 152 | 184 | Sn/Ag = 32.3 |
| 5,730,932 Sarkhel et al. 1998) | 80–81 Sn/2–4 Ag/5–6 In/10–12 Bi | 150–160 | 180–190 | Sn/Ag = 20–40 |
| Sn/Ag/In | 91.9 Sn/3.3 Ag/4.8 In | 212.1 | 213.5 | Sn/Ag = 27.8 |
| (U.S. Pat. No. | 87.7 Sn/3.2 Ag/9.1 In | 202.4 | 207.5 | Sn/Ag = 27.4 |
| 5,256,370 | 84.0 Sn/3.0 Ag/13.0 In | 194.1 | 199.2 | Sn/Ag = 28.0 |
| Slattery et al. 1993) | 80.4 Sn/2.9 Ag/16.7 In | 188.9 | 194.1 | Sn/Ag = 27.7 |
| | 77.2 Sn/2.8 Ag/20.0 In | 178.5 | 189.1 | Sn/Ag = 27.6 |
| | 74.2 Sn/2.7 Ag/23.1 In | 171.6 | 183.4 | Sn/Ag = 27.5 |
| | 71.5 Sn/2.6 Ag/25.9 In | 167.8 | 179.1 | Sn/Ag = 27.5 |
| Sn/Ag/Bi | 95.57 Sn/3.47 Ag/0.96 Bi | 218.1 | 218.1 | Sn/Ag = 27.6 |
| (U.S. Pat. No. | 94.63 Sn/3.44 Ag/1.93 Bi | 215.9 | 215.9 | Sn/Ag = 27.5 |
| 5,439,639 | 93.70 Sn/3.40 Ag/2.90 Bi | 215.1 | 215.1 | Sn/Ag = 27.6 |
| Vianco et al. 1995) | 92.76 Sn/3.37 Ag/3.87 Bi | 212.2 | 212.2 | Sn/Ag = 27.5 |
| | 91.84 Sn/3.33 Ag/4.83 Bi | 211.3 | >211.3 | Sn/Ag = 27.6 |
| Sn/Ag/Cu | 95.5 Sn/3.8 Ag/ 0.7 Cu | 217 | 217 | Sn/Ag = 25.1 |
| (Bath, J. et al., | 95.8 Sn/3.5 Ag/ 0.7 Cu | 217 | 217 | Sn/Ag = 27.4 |
| "Research Update: | 95.5 Sn/4.0 Ag/ 0.5 Cu | 217 | 217 | Sn/Ag = 23.9 |
| Lead-Free Solder | 95.5 Sn/3.9 Ag/ 0.6 Cu | 217 | 217 | Sn/Ag = 24.5 |
| Alternatives," Circuits Assembly, Vol. 11, No. 5, May 2000) | 95.5 Sn/3.6 Ag/ 0.9 Cu | 216–17 | 216–17 | Sn/Ag = 26.5 |

168–212° C., and the liquidus temperatures are in a range of about 179–214° C.

The Sn/Ag/Bi solder system comprises eutectic tin-silver (the Sn/Ag ratio is 27.6±0.1), so that the Sn/Ag/Bi alloys listed in Table 1 are differentiated solely by the percent composition of Bi ("% Bi") in a range of about 0–5%. The lower end of the range of % Bi does not include 0, but includes a positive, real number arbitrarily close to 0 as the Sn/Ag/Bi solder system approaches the Sn/Ag solder system. The solidus and liquidus temperatures are in a range of about 211–218° C.

The Sn/Ag/Cu solder system includes five distinct alloys that depress the solidus and liquidus temperature about 4–5° C. relative to eutectic Sn/Ag. The solidus and liquidus temperatures are in a range of about 216–217° C. The percent composition of Cu is about 0–1%.

Other alloys comprising eutectic tin-silver and one or more metals, and having a liquidus temperature that is less than the melting temperature of eutectic tin-silver, may be used in the present invention. Such other alloys include, inter alia, eutectic tin-silver and zinc.

Table 1 indicates numerous choices for the first joiner solder, the second joiner solder, and the core solder, for satisfying Equations (1) and (2). For example, any of the alloys of the Sn/Sb solder system may be used for the core solder in combination with any of the alloys of the remaining systems (i.e., Sn/Ag, Sn/Ag/In/Bi, Sn/Ag/In, Sn/Ag/Bi, Sn/Ag/Cu) for either or both of the first joiner solder and the second joiner solder, for satisfying Equations (1)–(2) or for satisfying equations having 10° C. margin between $T_{1L}$ and $T_{CS}$ (e.g., $T_{CS} > T_{1L} + 10°$ C.) and/or between $T_{2L}$ and $T_{CS}$ (e.g., $T_{CS} \geq T_{2L} + 10°$ C.). As another example, 96.5Sn/3.5Ag of the Sn/Ag solder system may be used for the core solder in combination with any of the alloys of the Sn/Ag/In/Bi, Si/Ag/In, Sn/Ag/Bi, or Sn/Ag/Cu solder systems for either or both of the first joiner solder and the second joiner solder, for satisfying Equations (1)–(2). If 10° C. margin between $T_{1L}$ and $T_{CS}$ and/or between $T_{2L}$ and $T_{CS}$ is desired, then 96.5Sn/3.5Ag of the Sn/Ag solder system may be used for the core solder in combination with any of the alloys of the Sn/Ag/In/Bi solder system, or with any of the alloys of the Si/Ag/In solder system such that the Sn content does not exceed 87.7% by weight. Note that the first joiner solder, the second joiner solder, and the core solder may be chosen from the same solder system. For example, the alloys of 55Sn/45Sb or 50Sn/50Sb of the Sn/Sb solder system may be used for the core solder in combination with any of the alloys of 97Sn/3Sb, 95Sn/5Sb, or 90Sn/10Sb for either or both of the first joiner solder and the second joiner solder, for satisfying Equations (1)–(2) or for satisfying equations having 10° C. margin between $T_{1L}$ and $T_{CS}$ (e.g., $T_{CS} > T_{1L} + 10°$ C.) and/or between $T_{2L}$ and $T_{CS}$ (e.g., $T_{CS} > T_{2L} + 10°$ C.). Many other alloy combinations, using diverse solder systems or staying within a given solder system, may be derived from Table 1 for satisfying Equations (1)–(2) or for satisfying equations having a given temperature margin between $T_{1L}$ and $T_{CS}$ and/or between $T_{2L}$ and $T_{CS}$.

For workability of the second joiner solder, Table 1 shows numerous possible choices for the first joiner solder, the second joiner solder, and the core solder for satisfying Equations (3), subject to the constraint that Equations (1)–(2) must also be satisfied. For simplicity of illustration for the following examples, assume that the core solder is any of the alloys of the Sn/Sb solder system, so that Equations (1)–(2) are satisfied for any choice from Table 1 of the first joiner solder and the second joiner solder. As a first example, 96.5 Sn/3.5Ag of the Sn/Ag solder system may be used for the first joiner solder in combination with any of the alloys of the Sn/Ag/In/Bi, Si/Ag/In, Sn/Ag/Bi, or Sn/Ag/Cu solder systems for the second joiner solder, for satisfying Equations (3). As a second example, the 95.57Sn/3.47Ag/0.96Bi alloy of the Sn/Ag/Bi solder system may be used for the first joiner solder in combination with any of the alloys of the Sn/Ag/In/Bi, Si/Ag/In, Sn/Ag/Cu solder systems, or with any alloy having a Sn content not exceeding 94.63% (by weight) of the Sn/Ag/Bi solder system, for the second joiner solder, for satisfying Equations (3). As a third example, the 91.9Sn/3.3Ag/4.8In alloy of the Sn/Ag/In solder system may be used for the first joiner solder in combination with any of the remaining alloys (Sn content exceeding 87.7% by weight) of the Sn/Ag/In solder system for the second joiner solder, for satisfying Equations (3). Many other alloy combinations, using diverse solder systems or staying within a given solder system, may be derived from Table 1 for satisfying Equations (3).

From the preceding discussion, the first joiner solder and the second joiner solder may each comprise an alloy of the same constituent metals; i.e., of the same solder system, for satisfying Equations (1)–(2) or Equations (1)–(3). Generally, the first joiner solder may comprise a first alloy of N distinct metals distributed by weight according to first weights, wherein the second joiner solder may comprise a second alloy of the same N distinct metals distributed by weight according to second weights, and wherein $N \geq 2$. If the first joiner solder and the second joiner solder comprise a same alloy, the first weight are about equal to the second weights. For example, both the first joiner solder and the second joiner solder may both comprise an alloy of Sn and Sb from the Sn/Sb solder system (N=2). To illustrate, the first joiner solder may be 55Sn/45Sb (first weights are 55 and 45) and the second joiner solder may be 90Sn/10Sb (second weights are 90 and 10). To further illustrate, the first joiner solder may be 85Sn/15Sb (first weights are 85 and 15) and the second joiner solder may be 85Sn/15Sb (second weights are 85 and 15; i.e., the second weights are equal to the first weights).

The specific examples of solders presented herein are merely illustrative. Any lead-free solders that satisfy Equations (1)–(2), and Equations (3) if reworkability of the second joiner solder is supported, may be used for the first joiner solder, the second joiner solder, and the core solder, including the use of solders that comprise an alloy and solders that comprise an individual metal.

Figure 2:
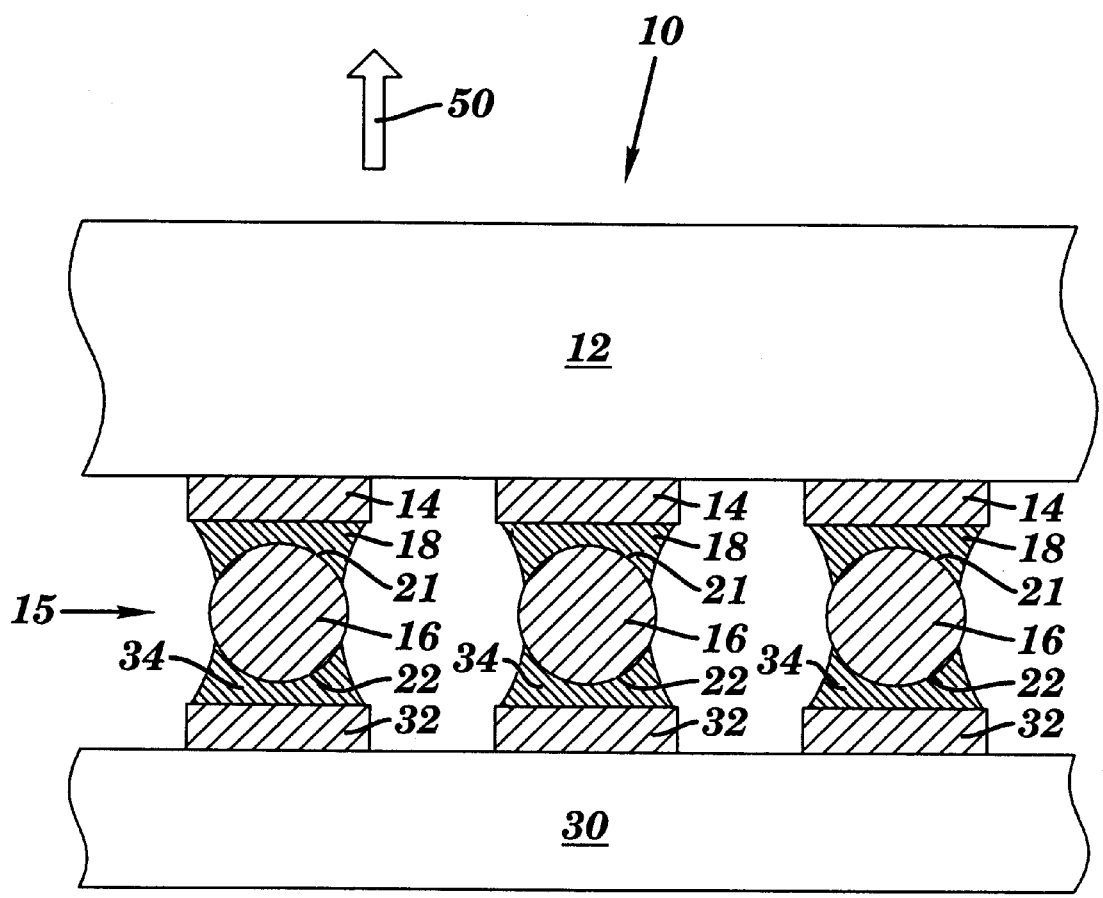
FIG. 2 depicts FIG. 1 with the solder column being replaced with a solder ball.

As stated supra, FIG. 2 differs from FIG. 1 in that the core interconnect 46 solder column of FIG. 1 has been replaced in FIG. 2 by the core interconnect 16 solder ball. Although the preceding detailed description made specific reference to FIG. 1, the preceding detailed description also applies to FIG. 2, as well as to any other core interconnect geometry that has a length in the axial direction 50.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

I claim:

1. A method of forming an electronic structure, comprising:

providing an electronic component, a joiner solder, and a core interconnect, wherein the joiner solder is lead free, wherein the core interconnect includes a core solder, wherein the core solder is lead free, and wherein a liquidus temperature $T_{1L}$ of the joiner solder is less than a solidus temperature $T_{CS}$ of the core solder;

soldering an end of the core interconnect to the electronic component with the joiner solder, including reflowing the joiner solder at a reflow temperature that is above $T_{1L}$ and below $T_{CS}$; and cooling the joiner solder to a temperature that is below a solidus temperature of the joiner solder.

2. The method of claim 1, wherein the core solder comprises essentially tin and antimony, and wherein a ratio of tin to antimony by weight is in a range of about 1–32.

3. The method of claim 1,
wherein the joiner solder comprises a metallic alloy selected from the group consisting of a tin-silver-indium-bismuth alloy, a tin-silver alloy, and a tin-silver-metal alloy,
wherein the tin-silver-indium-bismuth alloy consists essentially of about 80–81% tin, about 2–4% silver, about 5–6% indium, and about 10–12% bismuth,
wherein the tin-silver alloy consists essentially of eutectic tin-silver, and
wherein the tin-silver-metal alloy consists essentially of eutectic tin-silver and at least one additional metal such that a liquidus temperature of the metallic alloy is less than a melting temperature of eutectic tin-silver.

4. The method of claim 3, wherein the at least one additional metal is selected from the group consisting of indium comprising about 0–26% of the metallic alloy by weight, bismuth comprising about 0–5% of the metallic alloy by weight, and copper comprising about 0–1% of the metallic alloy by weight.

5. The method of claim 1, wherein the electronic component includes a chip carrier.

6. The method of claim 1, wherein the core interconnect is selected from the group consisting of a solder ball and a solder column.

7. A method of forming an electronic structure, comprising:
providing a module that includes a first electronic component, a first joiner interconnect, and a core interconnect, wherein the first joiner interconnect solderably couples a first end of the core interconnect to the first electronic component, wherein the first joiner interconnect includes a first joiner solder that is lead free and has a liquidus temperature $T_{1L}$, wherein the core interconnect comprises a core solder that is lead free and has a solidus temperature $T_{CS}$, and wherein $T_{1L} < T_{CS}$;
providing a second electronic component and a second joiner solder, wherein the second joiner solder is lead free and has a liquidus temperature $T_{2L}$, and wherein $T_{2L} < T_{CS}$;
soldering a second end of the core interconnect to the second electronic component with the second joiner solder, including reflowing the second joiner solder at a reflow temperature $T_{R2}$ that is above $T_{2L}$ and below $T_{CS}$; and
cooling the second joiner solder to a temperature that is below a solidus temperature of the second joiner solder.

8. The method of claim 7, wherein $T_{2L} = T_{1L}$.

9. The method of claim 7, wherein $T_{2L} < T_{R2} < T_{1M}$ such that $T_{1S} \leq T_{1M} < T_{1L}$, wherein $T_{1S}$ is a solidus temperature of the first joiner solder, and wherein $T_{1M}$ is a melt temperature of the first joiner solder.

10. The method of claim 7, wherein the first joiner solder comprises a first alloy of N distinct metals distributed by weight according to first weights, wherein the second joiner solder comprises a second alloy of the N distinct metals distributed by weight according to second weights, and wherein $N \geq 2$.

11. The method of claim 7, wherein the first weights are about equal to the second weights.

12. The method of claim 7, wherein the core solder comprises essentially tin and antimony, and wherein a ratio of tin to antimony by weight is in a range of about 1–32.

13. The method of claim 7,
wherein the first joiner solder comprises a first alloy selected from the group consisting of a first tin-silver-indium-bismuth alloy, a tin-silver alloy, and a first tin-silver-metal alloy,
wherein the first tin-silver-indium-bismuth alloy consists essentially of about 80–81% tin, about 2–4% silver, about 5–6% indium, and about 10–12% bismuth,
wherein the tin-silver alloy consists essentially of eutectic tin-silver,
wherein the first tin-silver-metal alloy consists essentially of eutectic tin-silver, and at least one additional metal such that a liquidus temperature of the first alloy is less than a melting temperature of eutectic tin-silver,
wherein the second joiner solder comprises a second alloy selected from the group consisting of a second tin-silver-indium-bismuth alloy and a second tin-silver-metal alloy,
wherein the second tin-silver-indium-bismuth alloy consists essentially of about 80–81% tin, about 2–4% silver, about 5–6% indium, and about 10–12% bismuth, and
wherein the second tin-silver-metal alloy consists essentially of eutectic tin-silver, and at least one added metal such that a liquidus temperature of the second alloy is less than the melting temperature of eutectic tin-silver.

14. The method of claim 13,
wherein the at least one additional metal is selected from the group consisting of indium comprising about 0–26% of the first alloy by weight, bismuth comprising about 0–5% of the first alloy by weight, and copper comprising about 0–1% of the first alloy by weight, and
wherein the at least one added metal is selected from the group consisting of indium comprising about 0–26% of the second alloy by weight, bismuth comprising about 0–5% of the second alloy by weight, and copper comprising about 0–1% of the second alloy by weight.

15. The method of claim 7, wherein the first electronic component includes a chip carrier, and wherein the second electronic component includes a circuit card.

16. The method of claim 7, wherein the core interconnect is selected from the group consisting of a solder ball and a solder column.

* * * * *